(12) United States Patent
Rodriguez Elizondo et al.

(10) Patent No.: US 9,890,453 B2
(45) Date of Patent: Feb. 13, 2018

(54) METHOD AND TOOL FOR THE VAPOUR PHASE DEPOSITION OF A METAL COATING ONTO PARTS MADE OF SUPERALLOYS

(71) Applicant: SNECMA, Paris (FR)

(72) Inventors: Gabriela Rodriguez Elizondo, Queretaro (MX); Stephane Vitrac, Queretaro (MX)

(73) Assignee: SNECMA, Paris (FR)

( * ) Notice: Subject to any disclaimer, the term of this patent is extended or adjusted under 35 U.S.C. 154(b) by 93 days.

(21) Appl. No.: 14/412,478

(22) PCT Filed: Jul. 1, 2013

(86) PCT No.: PCT/FR2013/051546
§ 371 (c)(1),
(2) Date: Jan. 2, 2015

(87) PCT Pub. No.: WO2014/006317
PCT Pub. Date: Jan. 9, 2014

(65) Prior Publication Data
US 2015/0152546 A1 Jun. 4, 2015

(30) Foreign Application Priority Data

Jul. 3, 2012 (FR) ..................................... 12 56376

(51) Int. Cl.
*C23C 10/08* (2006.01)
*C23C 16/08* (2006.01)
(Continued)

(52) U.S. Cl.
CPC .............. *C23C 16/08* (2013.01); *C23C 10/04* (2013.01); *C23C 10/08* (2013.01); *C23C 10/28* (2013.01); *C23C 16/458* (2013.01)

(58) Field of Classification Search
CPC .................. C23C 16/08; C23C 16/458; C23C 10/00–10/60
(Continued)

(56) References Cited

U.S. PATENT DOCUMENTS 4,965,095 A 10/1990 Baldi
5,071,678 A * 12/1991 Grybowski ............. C23C 10/08
427/253

(Continued)

FOREIGN PATENT DOCUMENTS

CN 1107898 A 9/1995
CN 1277267 A 12/2000
(Continued)

OTHER PUBLICATIONS

International Search Report dated Oct. 2, 2013 in PCT/FR2013/051546 Filed Jul. 1, 2013.

*Primary Examiner* — Elizabeth A Burkhart
(74) *Attorney, Agent, or Firm* — Oblon, McClelland, Maier & Neustadt, L.L.P.

(57) ABSTRACT

A method for vapor phase deposition of a metal coating onto parts made of superalloys, which includes arranging the parts in a chamber in a presence of grains of a donor of the coating metal and an activator capable of together forming a halide of the coating metal, and heating the chamber under an inert gas or reducing gas atmosphere to a temperature at which the coating metal halide reacts with the alloy of the parts. A bed of the grains is arranged on the bottom of at least one box, then a mounting for the parts is placed on the bed of grains, the mounting including support columns that keep the parts separate from the bed of grains, and the gas is injected into the box, when the box is closed, via a side located above the bed of grains.

16 Claims, 2 Drawing Sheets

(51) Int. Cl.
  *C23C 10/28* (2006.01)
  *C23C 16/458* (2006.01)
  *C23C 10/04* (2006.01)

(58) Field of Classification Search
  USPC .......................... 427/250, 252–253; 118/728
  See application file for complete search history.

(56) References Cited

U.S. PATENT DOCUMENTS

| | | | | |
|---|---|---|---|---|
| 5,149,376 | A * | 9/1992 | Fournes | C23C 10/08 |
| | | | | 118/719 |
| 5,368,888 | A * | 11/1994 | Rigney | C23C 10/06 |
| | | | | 118/500 |
| 6,203,851 | B1 * | 3/2001 | Walter | C23C 10/06 |
| | | | | 427/248.1 |
| 6,589,668 | B1 * | 7/2003 | Braithwaite | F01D 5/288 |
| | | | | 416/241 R |
| 2002/0102357 | A1 | 8/2002 | Das et al. | |
| 2004/0112287 | A1 | 6/2004 | Dautl et al. | |
| 2004/0151834 | A1 | 8/2004 | Wustman et al. | |
| 2006/0147625 | A1 * | 7/2006 | Seidel | C23C 10/08 |
| | | | | 427/248.1 |

FOREIGN PATENT DOCUMENTS

| | | |
|---|---|---|
| CN | 202072756 U | 12/2011 |
| FR | 2 900 416 | 11/2007 |
| RU | 2 291 913 C2 | 1/2007 |
| RU | 2 350 685 C2 | 3/2009 |

\* cited by examiner

METHOD AND TOOL FOR THE VAPOUR PHASE DEPOSITION OF A METAL COATING ONTO PARTS MADE OF SUPERALLOYS

TECHNICAL FIELD OF THE INVENTION

The present invention relates to the deposition of a protective coating, in particular based on aluminium, on a metal part. It relates in particular to the application of such a coating to turbine engine parts, movable or stator blades of a gas turbine engine.

PRIOR ART

A gas turbine engine, as used for propulsion in the aeronautical field, functions at a temperature of the driving gases driving the turbines that needs to be as high as possible since the energy efficiency is related thereto. For this purpose the materials are selected so as to withstand these operating conditions, and the walls of the parts swept by the hot gases—movable turbine fins or nozzles—are provided where applicable with internal cooling means. Moreover, because of their metal constitution made from a superalloy based on nickel or cobalt, it is also necessary to protect them from the erosion and corrosion caused by the constituents of the driving gases at these temperatures.

One known means for protecting these parts is to deposit a metal coating, preferably based on aluminium, on the surfaces liable to being degraded by the gases. The aluminium is fixed to the substrate by metal interdiffusion and forms a protective surface oxide layer.

The thickness of the coating is around a few tens of microns.

The present invention relates to the technique, known per se, of depositing aluminium in vapour phase, also referred to as aluminising by vapour phase deposition. According to the method, the parts to be treated are disposed in a semi-sealed chamber in which the atmosphere is formed by a mixture of an inert or reducing gas, for example argon or hydrogen, and an active gas comprising an aluminium halide. At the reaction temperature, between 900° C. and 1150° C., the halide decomposes on the surface of the part into gaseous halogen and aluminium that diffuses into the metal.

The halide is produced by disposing in the chamber, with the parts to be treated, a cement that is a donor of metallic aluminium or metallic aluminium alloy with one or more metal constituents, in particular chromium, of the material forming the parts to be protected, in the presence of granules of a halogen compound, chlorine or fluorine, which form the activator. The inert gas is circulated over the activator at a temperature allowing sublimation of the halogen, which is entrained over the donor, and with which it reacts in order to produce the metal halide which, at this temperature, is in vapour form.

Since the activator has to be gaseous at the coating temperature and not produce contaminants, generally products such as ammonium chloride, ammonium fluoride or ammonium bifluoride are selected. In the presence of hydrogen or in a neutral gas and at high temperature, these molecules decompose into ammonium and halogen. The vaporisation temperature depends on the nature of the halogenated salt selected. For example, it is 340° C. for ammonium chloride. The activator is used only to transport, in complete safety, a halogenated acid into the reactor where the deposition is to be carried out, that is to say the semi-sealed box. The cation bonded to this halogen (in this case ammonium) is consequently not useful to the reaction.

The halide then decomposes in contact with the metal substrate to be coated, allowing the aluminium to be deposited. During the aluminising a cyclic process of deposition of aluminium starts, continuing continuously until the aluminium activity on the surface of the substrate becomes equal to the activity imposed by the cement. The gaseous halogen is reformed. The coating obtained optionally serves as an intermediate layer between the metal substrate and a thermal protection barrier for this substrate to which it has just been applied. The coating also improves the strength of the thermal barrier on the substrate and the ability of said coating to preserve use characteristics in the event of degradation of the thermal barrier.

The industrial implementation of the method is, however, of high cost, in particular because of the short service life of the tools and the preparation time.

The equipment of the prior art comprises boxes with a circular shape in which graphite braces are installed in a cylindrical assembly. This assembly is placed in a treatment furnace in a reducing or neutral atmosphere. It is agreed that, in order to obtain a sufficient thickness of deposition on the parts, the aluminium donor must be placed vertically in the baskets between the parts being treated.

This solution has several drawbacks.

The braces and the baskets occupy a large amount of space, reducing the volume available for the parts, and making the tool system complex owing to the guides, welds, mechanical fixings and weight that are associated therewith.

They also, when there is for example contact and bonding with the tool, give rise to defects on the parts, making them non-compliant.

As the tools are subjected to the same treatment as the parts, they deform, limiting their service life. The deformations may cause leakages of aluminising atmosphere causing parts to be obtained having depositions outside the prescribed tolerances.

The large surface area of the tool involves parasitic depositions that lead to high consumptions of donor. The efficiency of the method then falls rapidly if the donor device is not recharged.

The present applicant has presented a variant of this type of method in the patent EP-B-068 950, according to which the donor is in the form of a thin sheet disposed, in concentric cylinders for example, so that each of the surfaces to be coated faces a sheet or a portion of a sheet with a surface area of the same order of magnitude.

According to another variant described in EP-B-349 420, also in the name of the applicant, the treatment is carried out in a box with a donor bed, the gas being introduced through the bottom of the bed, which rests on a grid.

SUBJECT MATTER OF THE INVENTION

The applicant set itself the object of improving the method by reducing the influence of the tool thereon while increasing the volume thereof available for disposing additional parts inside the boxes. In particular the applicant has sought to reduce the surface area of the tool with respect to that of the parts, and the quantity and weight of the equipment.

The method according to the invention for depositing a metal coating in vapour phase on parts made of heat-resistant alloys, comprising the arrangement of the parts in a chamber in the presence of grains of a donor of the metal and an activator capable of together forming a halide of the metal, heating the chamber in an atmosphere of a neutral or reducing gas, to the temperature at which the halide of the metal formed reacts with the alloy of the parts, is characterised in that a bed of said grains is disposed on the bottom of at least one box, and then a support for the parts is placed on the bed of grains, said support comprising support columns that keep the parts at a distance from the bed of grains, and in that the gas is introduced into the box, when it is closed, through the side above the bed of grains.

By changing the arrangement of the donor, the constraints related to the supports for the parts are eliminated. The donor grains are disposed in a layer on the bottom of the box, and the grains of the activator are deposited on the donor grains.

The solution is advantageous since it makes it possible, in particular:
- to increase the density of the parts in the furnace during treatment,
- not to increase the consumption of the donor despite the high number of parts per operation,
- to improve the efficiency of the method, by favouring horizontal planes for holding the parts and forming sealed separations, leakages are reduced,
- to reduce the cost of the tools and equipment per part and in general to exert less stress thereon,
- to design tools that are simpler and have a longer service life,
- to reduce the cycle time by reducing the charge preparation operations.

Compared with the solution of the prior art with the use of baskets, it has been found that, with the vapour phase aluminising commencing with a gas that moves in the chamber, the gas fills the complete volume of the box more quickly. Furthermore, without a basket or vertical separation, the gas can also circulate much more easily. Moreover, the aluminium is deposited more easily in a space just occupied by the parts. Finally, the free surface of donor at the bottom of the box, without any barrier, is much greater; there is no barrier or interfering element between the donor and the parts.

Compared with the solution of EP-B-349 420, supplying, according to an invention, gas both through the side, just above the donor bed, and through the cover, the boxes are perfectly purged up to 350 degrees and any trace of oxygen in particular is eliminated. On the other hand, the introduction of argon through the bottom poses a problem of contamination of the parts by the blowing of dust. It has moreover been found that the pipes under the donor have a tendency to become blocked. Finally, the aluminising capacity is not optimal because of the arrangement of the activator with respect to the gas supply.

Advantageously, the parts are arranged in at least two superposed boxes, the bottom of the top box forming a cover for the bottom box, which comprises a central column supporting the top box, a cover being placed on the top box.

The invention also relates to tool for implementing the method. The tool comprises at least first and second boxes made of metal with a flat bottom, each box having a circular shape and comprising a central column forming a support as well as a tube discharging inside its side wall and at least one support for the parts comprising support columns, a cover covering the top box. More particularly, the top edge of the boxes is arranged so as to receive the bottom of the box that is placed on top.

Advantageously, the central column of at least one first box has a tubular shape, the hollow of which discharges by forming a central opening under the bottom of the box, and the central column of at least one second central box has a shape at the top allowing contact with the inside of the edge of the central opening of the bottom of the first box when said first box is placed on top.

By fitting one inside the others the central columns individual to each box reconstruct a global central column that takes the weight of the charge for each box at the centre of its bottom and which, in addition, serves as a central structure stiffening the stack of boxes.

The boxes contain a suitable support for the parts. According to one application, the support has a plate that is parallel to the bottom of the box and is provided with openings for housing the parts. Advantageously, the support comprises no more than one column supporting the plate for five openings housing the parts. The device thus makes it possible to obtain a high density of parts to be treated in a box without interfering with the circulation of the gas for depositing the aluminium layer. The application is for example the treatment of movable turbine blades or internal jackets for hollow blades of a turbine engine.

According to another application, the boxes comprise individual supports for turbine nozzles.

PRESENTATION OF THE FIGURES

Other features and advantages will emerge from the following description of a non-limiting embodiment of the invention, with reference to the accompanying drawings, in which.

DETAILED DESCRIPTION OF AN EMBODIMENT

The thermochemical aluminising treatment consists in superficially enriching with aluminium the surface of a part for the purpose of improving resistance to hot oxidation, up to 1100° C., corrosion resistance, in particular in the simultaneous presence of oxygen, sulfur through kerosene and/or sodium chloride through salt spray, and the region in which the oxidation/corrosion phenomena due to the temperature of the combustion gases are encountered.

Figure 1:
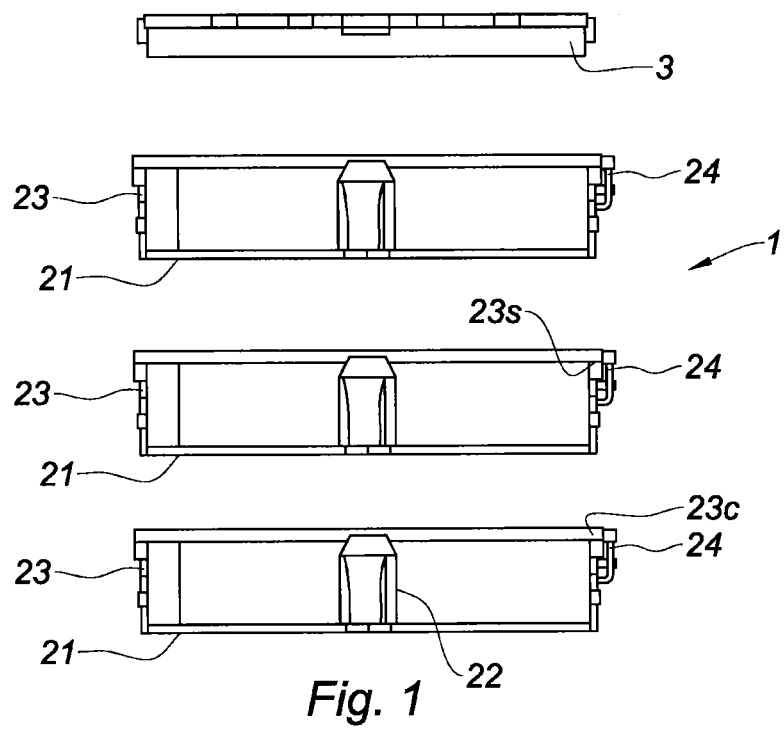
FIG. 1 is a cross section of a tool comprising three boxes and a cover before assembly on one another.
Figure 2:
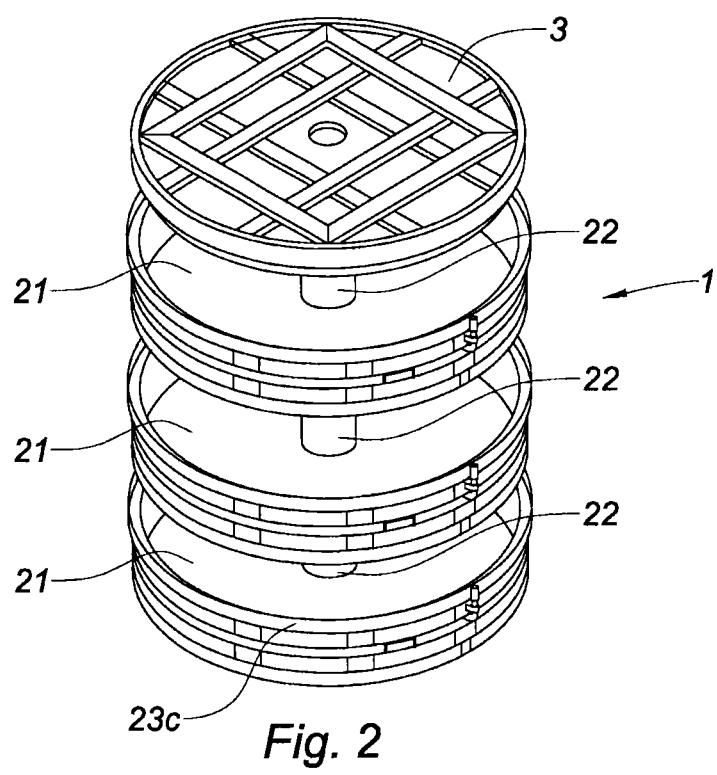
FIG. 2 is a perspective view of the tool from FIG. 1.

FIGS. 1 and 2 are an example embodiment of a tool according to the invention. It comprises a set of three boxes 2, here ready to be placed on top of one another. Each box is circular in shape with a tray 21 formed by a plate reinforced so as to be able to support a bed formed by donor and activating grains as well as the parts to be treated. The plate 21 here comprises a circular opening at the centre with a hollow central column 22 fixed in the opening and forming a support. The function of the column is to support the bottom and to prevent its deforming. The box comprises a side wall 23 with the same height as the column 22. This wall is reinforced by peripheral ribs. A tube 24 is disposed on the wall 23 and discharges into the box. It serves to supply the box with neutral gas, such as argon, or reducing gas. The top edge 23s of the wall 23 is provided with a peripheral centring sheet 23c. A cover 3 closes the top box.

For assembling the tool, the middle box is placed on the bottom box, the bottom coming into abutment on the edge of the bottom box inside the peripheral centring sheet 23c and on the column 22 at the centre, the upper frustoconical shape of which allows contact with the edge of the central opening of the box that is resting on top of it. The top box is placed on the middle box in the same way. The vertical forces are transmitted along the side walls through the edges of the boxes and the central columns.

Figure 3:
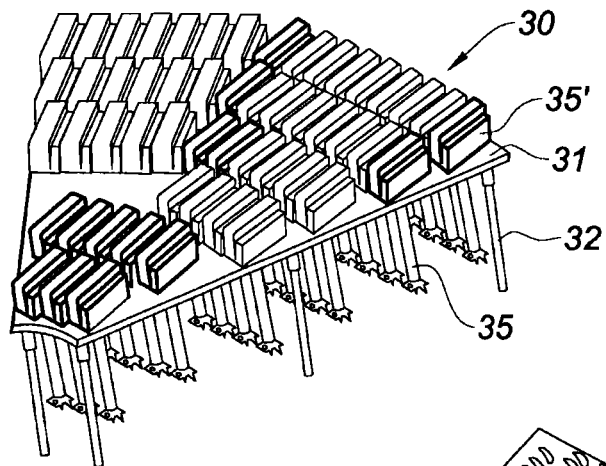
FIG. 3 shows a support sector for movable turbine blades.

To load the boxes, supports suited to the parts to be treated are arranged. FIG. 3 shows a support sector 30 for movable blades 35. The roots of the blades are enclosed in masks 35', the function of which is precisely to prevent the aluminising of this portion of the parts. It is desired in fact that this part is not treated. The blades are thus suspended head-down in the plate 31 of the support, of which the number and arrangement of the compartments are determined so as to have maximum loading with regard to the size of the parts and the need not to have contact. Unlike the tools of the prior art, there are no constraints concerning the position of the parts to be treated with respect to the donor since said donor is placed under the parts and not therebetween. The height of the columns 32 of the support corresponds to the height of the side walls 23 of the boxes and to the need to maintain sufficient space with the bottom so that there is no contact between the donor and the parts. For example, the plate 31 of the support 30 covers a sector of 60° in the internal annular space of the box 2, the plate can receive fifty-seven blades 35, and only nine columns 32 distributed over its surface are sufficient to provide a stable seat therefor. For loading a box 2, the first step is to arrange a layer of donor grains on the bottom of the box 2, then a layer of activator grains. The blades are placed in the support sectors 30. Then the loaded supports are placed in the box 2. In fact, the donor grain bed is used as ballast that is always flat, on which the supports are placed in a very stable manner without any risk of imbalances causing contact between the parts. The same procedure is followed with the other boxes and then the cover is placed on the set of three loaded boxes and the loaded tool is placed in the furnace for treatment. For the treatment, the individual closed chambers that constitute the boxes and the closure plate are purged; then the chambers swept by the argon gas for example, introduced through the tubes 24, are gradually heated at up to 350 degrees. At this temperature the purging is stopped.

Figure 4:
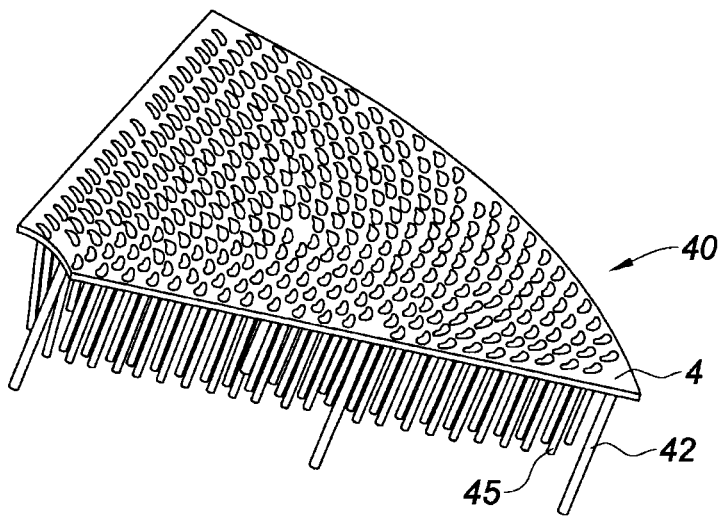
FIG. 4 shows a support sector for cooled nozzle blade jackets.

FIG. 4 shows a sector of a support 40 for internal nozzle jackets 45, as described for example in the patent application FR 2 921 937 in the name of the applicant. Unlike the movable blades, the part can be treated over the entire surface thereof and does not require masking. As can be seen in the figure, it is possible because of this to dispose a larger number of parts on the support 40. The support comprises a plate 41 with individual compartments in it for the jackets 45, which are thus suspended and held by their collar at one end. The height of the columns 42 is determined as before according to the layer formed from the donor and activator grains deposited on the bottom of the box. In this example, the plate 41 of the support 40 can receive three hundred and thirty three nozzle jackets 45 with only seven columns 42 for support thereof.

Figure 5:
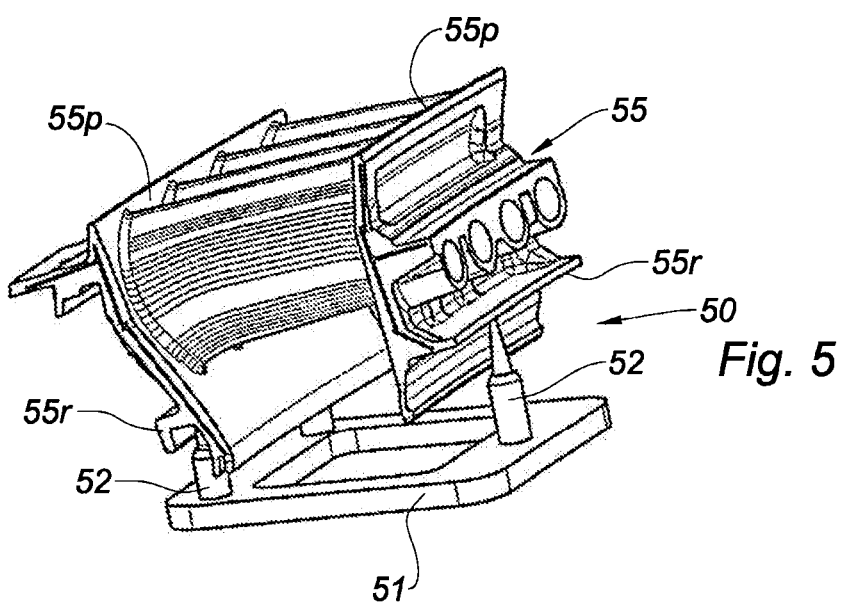
FIG. 5 shows a support for a turbine nozzle sector.

FIG. 5 shows a support 50 for a turbine nozzle sector 55. The shape of said sector does not allow suspension thereof through a plate. The nozzles are supported individually on a support 50 that comprises a base 51 and three support columns 52. The nozzle sector comprises two platforms 55p connecting the vanes of the sector together and radial flanges 55b external to the vanes with respect to the platforms 55p. The sector rests on the support columns 52 through the radial flanges 55r. In the box of the tool the support rests through the base 51 on the layer of donor and activator grains. The height of the columns is sufficient to prevent any contact between the donor and the nozzle sector.

The solution of the invention allows a significant gain with respect to the method of the prior art with baskets containing the donor grains and an improvement in the quality of the aluminium layer. The gain results in a greater density of parts treated per batch. The density is multiplied by at least 2.5 for the movable blades, and by up to 10 for the jackets. Simultaneously, the cost of the tools and consumables has been divided by three: the service life of the boxes is three times longer; the service life of the donor has been multiplied by four, the baskets of the donor have been eliminated as well as the fixing devices. Simplification has also made it possible to divide by two the duration of an operation cycle.

The invention claimed is:

1. A method for depositing a metal coating in vapour phase on parts made from heat-resistant alloy, comprising:
    providing a box, the box including a plate forming a bottom of the box, a central column fixed in an opening in the plate forming the bottom of the box, and a side wall having a same height as the central column;
    arranging, on the bottom of the box, a first layer of grains of a donor of the coating metal on the bottom of the box and a second layer of grains of an activator capable of together forming a halide of the coating metal so as to form a bed of grains on the bottom of the box;
    providing a support for the parts, the support including columns having a same height as the height of the side wall of the box, and a plate supported by the columns of the support;
    arranging the parts on the plate of the support such that the parts are suspended from the plate of the support;
    placing the support on top of the bed of grains disposed on the bottom of the box such that the parts are kept at a distance above the bed of the grains so as to be free of contact with the bed of the grains, the plate of the support being parallel to the bottom of the box;
    closing the box so as to form a chamber; and
    heating the chamber in an atmosphere of a neutral or reducing gas, to a temperature at which the halide of the coating metal formed reacts with the alloy of the parts, the gas being introduced into the chamber through the side wall of the box above the bed of grains.

2. A method according to claim 1, wherein a portion of each part that is not to be covered in a mask is enclosed.

3. A method according to claim 2, wherein the part is suspended in the plate of the support, to hold a portion of the part not covered by the mask under the plate.

4. A method according to claim 1, wherein the parts are disposed in at least two superposed boxes, a bottom of a top box forming a cover for a bottom box, which includes the central column supporting the top box, a cover being placed on the top box.

5. A method according to claim 1, wherein all of the parts are kept at a same distance above the bed of the grains.

6. A method according to claim 1, wherein the bed of the grains is flat.

7. A tool for implementing the method according to claim 1, comprising:
    the box, the box comprising a plate forming a bottom of the box, a central column fixed in an opening in the plate forming the bottom of the box, and a side wall having a same height as the central column, a top edge of the side wall being provided with a peripheral centering sheet; and the support for the parts, the support including columns having a same height as the height of the side wall of the box, and a plate supported by the columns of the support, the plate including compartments for suspending the parts.

8. A tool according to claim 7, wherein the support is arranged to receive movable turbine blades and comprises no more than one column supporting the plate for four compartments suspending the parts.

9. A tool according to claim 7, wherein the support is arranged to receive internal jackets for hollow turbine engine blades and comprises no more than one column for supporting the plate for twenty compartments suspending the parts.

10. A tool according to claim 7, comprising at least first and second boxes made of metal with a flat bottom, each box having a circular shape and comprising the central column forming a support, a cover covering a top box, and a tube discharging inside the side wall.

11. A tool according to claim 10, wherein a top edge of the boxes is arranged to receive a bottom of the box that is placed on top.

12. A tool according to claim 11, comprising at least one first box, the central column of which has a tubular shape, a hollow of which discharges by forming a central opening under the bottom of the box, and at least one second box, the central column of which has a shape at the top allowing contact with an inside of an edge of the central opening of a bottom of the first box when the first box is placed on top.

13. A method for depositing a metal coating in vapour phase on parts made from heat-resistant alloy in a tool, the tool comprising a first box and a second box, each of the first and second boxes forming a chamber and having a bottom and a side wall, and first and second supports for the parts, each support being placed in said first and second boxes, each support including a plate parallel to the bottom and columns supporting each plate, said columns being a same height as the side wall, the side wall of the first and second boxes forming the lateral wall of the tool,
the method comprising:
arranging on the bottom of each of the first and second boxes, a first layer of grains of a donor of the coating metal and a second layer of grains of an activator capable of together forming a halide of the coating metal;
arranging the parts on the plate of each of the first and second supports such that the parts are suspended from the plate of each of the first and second supports;
placing the first support on top of the bed of grains disposed on the bottom of the first box such that the parts are kept at a distance above the bed of the grains so as to be free of contact with the bed of the grains, and placing the second support on top of the bed of grains disposed on the bottom of the second box such that the parts are kept at a distance above the bed of the grains so as to be free of contact with the bed of the grains, the plate of the first support being parallel to the bottom of the first box and the plate of the second support being parallel to the bottom of the second box; and
heating the chambers in an atmosphere of a neutral or reducing gas, to a temperature at which the halide of the coating metal formed reacts with the alloy of the parts, wherein the gas is introduced into the first and second boxes, when at least the first box is closed, through the side wall of the first box above the bed of the grains, the first box is closed by the bottom of the second box placed removably above the support and a top edge of the side wall of the first box.

14. A method for depositing a metal coating in vapour phase on parts made from heat-resistant alloy, the method comprising:
arranging the parts on supports, each support having a plate and columns supporting the plate, the parts being suspended from the plate,
providing a tool comprising at least a first box and a second box, each of the first and second boxes having a bottom and a side wall;
disposing a bed of grains on each bottom of the first and second boxes, the bed of grains including a donor of the coating metal and an activator capable of together forming a halide of the coating metal;
arranging the supports with the parts inside the first and second boxes, each support for the parts being placed above the bed of the grains of each of the first and second boxes and the parts are kept at a distance above the bed of the grains of each of the first and second boxes so as to be free of contact with each bed of the grains, the columns of each support being a same height as the side wall of the first and second boxes;
arranging the second box on top of the first box, the bottom of the second box forming a cover for the first box and, each side wall of the first and second boxes forming a lateral wall of the tool; and
introducing a gas into at least the first box which is closed and to heat the first box in an atmosphere of a neutral or reducing gas, to a temperature at which the halide of the coating metal formed reacts with the alloy of the parts, the gas is introduced though a side wall of at least the first box above the bed of grains.

15. The method according to claim 14, wherein the bottom of the second box is placed above the plate on which the parts are suspended and is in contact with a top edge of the side wall of the first box.

16. A method for depositing a metal coating in vapour phase on parts made from heat-resistant alloy, comprising:
providing a box, the box including a plate forming a bottom of the box, and a side wall;
arranging, on the bottom of the box, a first layer of grains of a donor of the coating metal on the bottom of the box and a second layer of grains of an activator capable of together forming a halide of the coating metal so as to form a bed of grains on the bottom of the box;
providing a support for the parts, the support including columns having a same height as the height of the side wall of the box, and a plate supported by the columns of the support;
arranging the parts on the plate of the support such that the parts are suspended from the plate of the support;
placing the support on top of the bed of grains disposed on the bottom of the box such that the parts are kept at a distance above the bed of the grains so as to be free of contact with the bed of the grains, the plate of the support being parallel to the bottom of the box;
closing the box so as to form a chamber; and
heating the chamber in an atmosphere of a neutral or reducing gas, to a temperature at which the halide of the coating metal formed reacts with the alloy of the parts, the gas being introduced into the chamber through the side wall of the box above the bed of grains,
wherein the parts occupy at least 60% of the surface of the support.

* * * * *